(12) United States Patent
Fritz et al.

(10) Patent No.: US 8,955,927 B2
(45) Date of Patent: Feb. 17, 2015

(54) EQUIPMENT RAIL AND BRACKET ASSEMBLY

(75) Inventors: Robert L. Fritz, Elwood, IL (US);
Bruce R. Appino, Wood Dale, IL (US);
Samuel J. Adducci, Palos Heights, IL (US)

(73) Assignee: Panduit Corp., Tinley Park, IL (US)

( * ) Notice: Subject to any disclaimer, the term of this patent is extended or adjusted under 35 U.S.C. 154(b) by 228 days.

(21) Appl. No.: 13/289,333

(22) Filed: Nov. 4, 2011

(65) Prior Publication Data
US 2012/0118837 A1 May 17, 2012

Related U.S. Application Data

(60) Provisional application No. 61/412,439, filed on Nov. 11, 2010.

(51) Int. Cl.
| | | |
|---|---|---|
| *A47B 43/00* | (2006.01) | |
| *A47B 47/02* | (2006.01) | |
| *A47B 96/14* | (2006.01) | |
| *H05K 7/18* | (2006.01) | |

(52) U.S. Cl.
CPC ............... *A47B 47/02* (2013.01); *A47B 96/14* (2013.01); *H05K 7/183* (2013.01)
USPC .......................................... 312/257.1; 403/70

(58) Field of Classification Search
USPC ............ 312/257.1, 265.1; 211/191, 192, 103; 403/68, 70, 71; 52/655.1
See application file for complete search history.

(56) References Cited

U.S. PATENT DOCUMENTS

| | | | | |
|---|---|---|---|---|
| 3,814,491 | A | * | 6/1974 | Kackley ..................... 312/257.1 |
| 3,881,829 | A | | 5/1975 | James |
| 5,094,622 | A | | 3/1992 | Auclair |
| 5,306,080 | A | | 4/1994 | Lautenschläger et al. |
| 5,326,162 | A | | 7/1994 | Bovermann |
| 5,624,045 | A | | 4/1997 | Highsmith et al. |
| 5,664,392 | A | * | 9/1997 | Mucha ........................... 52/715 |
| 5,671,580 | A | * | 9/1997 | Chou ........................... 52/656.4 |
| 5,807,008 | A | | 9/1998 | Schwenk et al. |
| 6,021,909 | A | | 2/2000 | Tang et al. |
| 6,036,290 | A | | 3/2000 | Jancsek et al. |
| 6,123,203 | A | | 9/2000 | Gibbons |
| 6,478,166 | B2 | | 11/2002 | Hung |
| 6,785,459 | B2 | | 8/2004 | Schmidt et al. |
| 7,187,543 | B2 | | 3/2007 | Zimlin |

(Continued)

FOREIGN PATENT DOCUMENTS

| | | |
|---|---|---|
| EP | 2330703 A2 | 6/2011 |
| GB | 2037573 A | 7/1980 |

OTHER PUBLICATIONS

Teraframe™ User's Manual, Chapter 3—Installation Equipment; Chatsworth Products, Inc., one page.

*Primary Examiner* — Daniel Rohrhoff
(74) *Attorney, Agent, or Firm* — Christopher S. Clancy; James H. Williams

(57) ABSTRACT

An equipment rail and bracket assembly is provided. The equipment rail and bracket assembly includes an equipment rail and a bracket. The equipment rail is mounted to the bracket. The equipment rail includes a relief cut-out and a flexible tongue formed by the relief cut-out. The flexible tongue includes a bracket mounting opening for mounting the equipment rail to the bracket. The flexible tongue rotates relative to the equipment rail when the bracket is mounted to a cabinet.

13 Claims, 17 Drawing Sheets

(56) References Cited

U.S. PATENT DOCUMENTS

| | | |
|---|---|---|
| 7,293,666 B2 | 11/2007 | Mattlin et al. |
| 7,472,970 B2 | 1/2009 | Bergesch et al. |
| 7,494,101 B2 * | 2/2009 | Chen .......................... 248/298.1 |
| 7,498,512 B2 | 3/2009 | Adducci et al. |
| 7,740,329 B2 | 6/2010 | Hsiung et al. |
| 8,033,406 B2 | 10/2011 | Mattlin et al. |
| 8,397,458 B2 * | 3/2013 | Tedesco et al. ............ 52/506.05 |
| 2008/0062654 A1 | 3/2008 | Mattlin et al. |
| 2008/0079340 A1 | 4/2008 | Adducci et al. |
| 2009/0223166 A1 * | 9/2009 | Ohata et al. ..................... 52/699 |

* cited by examiner

US 8,955,927 B2

EQUIPMENT RAIL AND BRACKET ASSEMBLY

CROSS-REFERENCE TO RELATED APPLICATIONS

This application claims the benefit of U.S. Provisional Patent Application No. 61/412,439, filed on Nov. 11, 2010, the subject matter of which is incorporated by reference in its entirety.

BACKGROUND OF THE INVENTION

The present invention relates to an equipment rail and bracket assembly, and more particularly, an equipment rail and bracket assembly for a cabinet.

FIGS. 1-8 illustrate an equipment rail and bracket assembly 100, such as Panduit's Equipment Rail and Bracket Assembly (e.g., Part. No S75RC), according to the prior art.

As shown in FIGS. 1-3, the equipment rail and bracket assembly 100 includes an equipment rail 110 and a pair of bracket assemblies 120. Each of the bracket assemblies 120 includes a bracket 121, a clamp 122, and a plurality of fasteners 123 for mounting the equipment rail 110 to the bracket 121 and the bracket 121 to the clamp 122. The equipment rail 110 includes a plurality of bracket mounting openings 111 for receiving the fasteners 123 to mount the equipment rail 110 to the bracket 121. Additionally, the equipment rail 110 includes a plurality of equipment mounting openings 112 for receiving fasteners (not shown), such as cage nuts, to mount equipment (not shown), such as servers and switches, to the equipment rail 110.

As shown in FIGS. 4-6, the equipment rail and bracket assembly 100 is mounted to a cabinet 10, such as Panduit's Net-SERV™ Cabinet (e.g., Part No. S752C122B). The cabinet 10 includes 4 posts 11, 4 front-to-back beams 12, and 4 side-to-side beams 13, which are welded together at respective corners.

As shown in FIGS. 7 and 8, when the cabinet 10 is assembled, the front-to-back beams 12 are oriented at slight angles with respect to the posts 11. Consequently, when the equipment rail and bracket assembly 100 is mounted to the cabinet 10, the orientation of the front-to-back beams 12 causes the equipment rail 110 to bow, which is particularly undesirable when mounting equipment of a fixed width.

Therefore, there is a need for an improved equipment rail and bracket assembly for a cabinet.

SUMMARY OF THE INVENTION

Certain embodiments of the present invention provide an equipment rail and bracket assembly. The equipment rail and bracket assembly includes an equipment rail and a bracket. The equipment rail is mounted to the bracket. The equipment rail includes a relief cut-out and a flexible tongue formed by the relief cut-out. The flexible tongue includes a bracket mounting opening for mounting the equipment rail to the bracket. The flexible tongue rotates relative to the equipment rail when the bracket is mounted to a cabinet.

DETAILED DESCRIPTION

FIGS. 9-16 illustrate an equipment rail and bracket assembly 200 according to an embodiment of the present invention.

Figure 1:
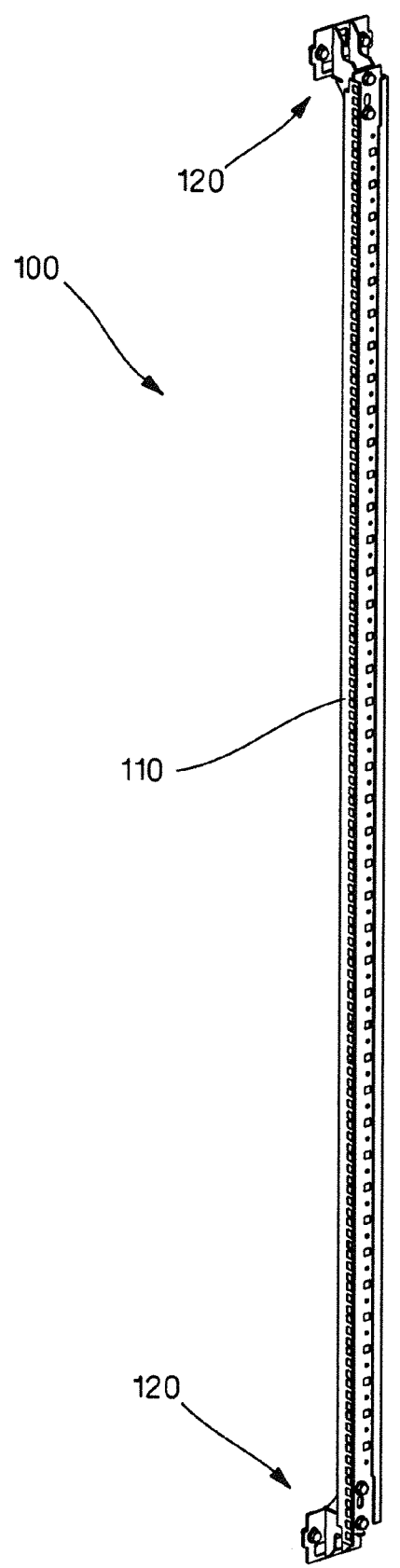
FIG. 1 is a perspective view of an equipment rail and bracket assembly according to the prior art.
Figure 2:
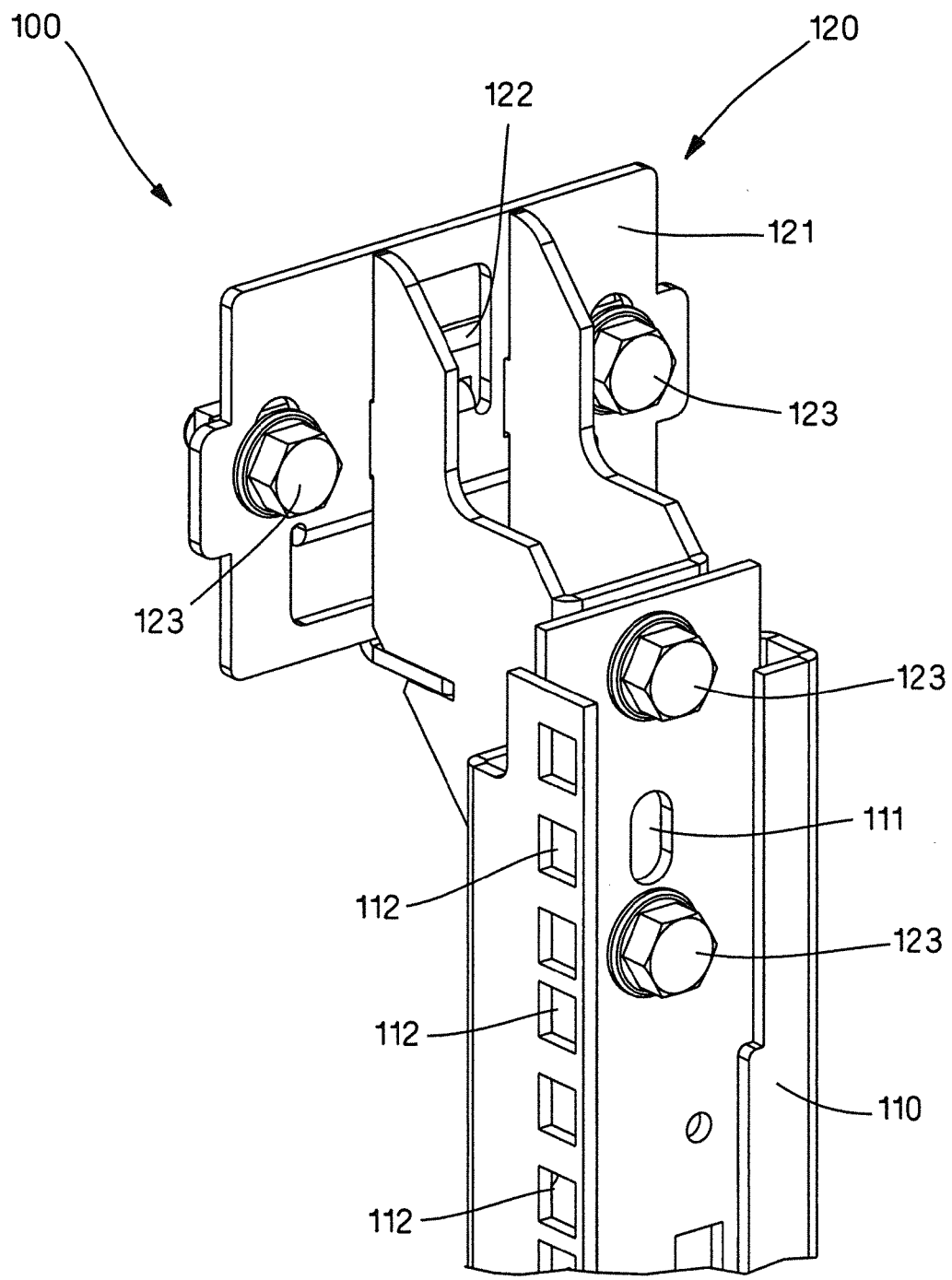
FIG. 2 is an enlarged view of the equipment rail and bracket assembly of FIG. 1, showing the top portion thereof.
Figure 3:
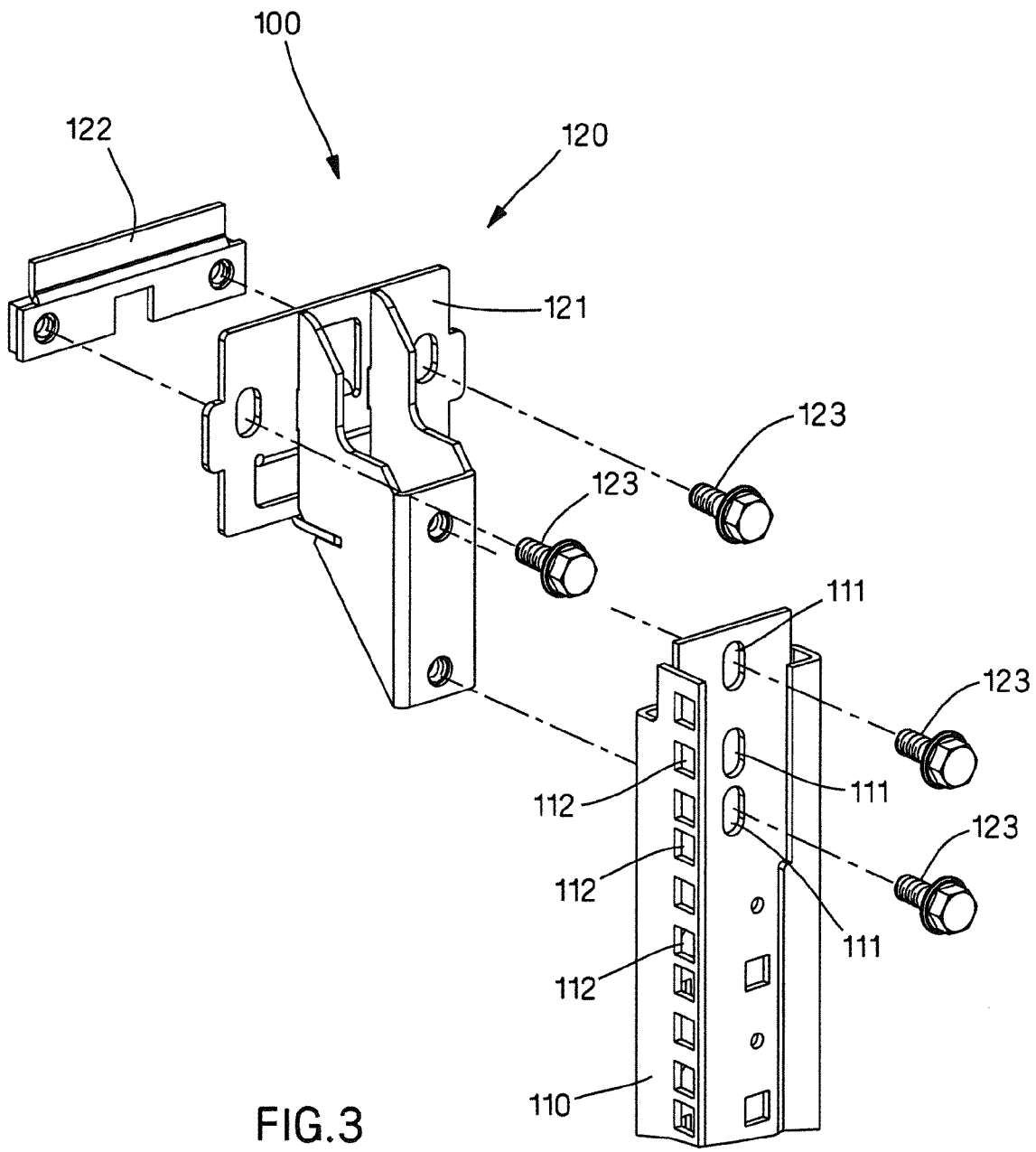
FIG. 3 is an exploded view of the equipment rail and bracket assembly of FIG. 2.
Figure 4:
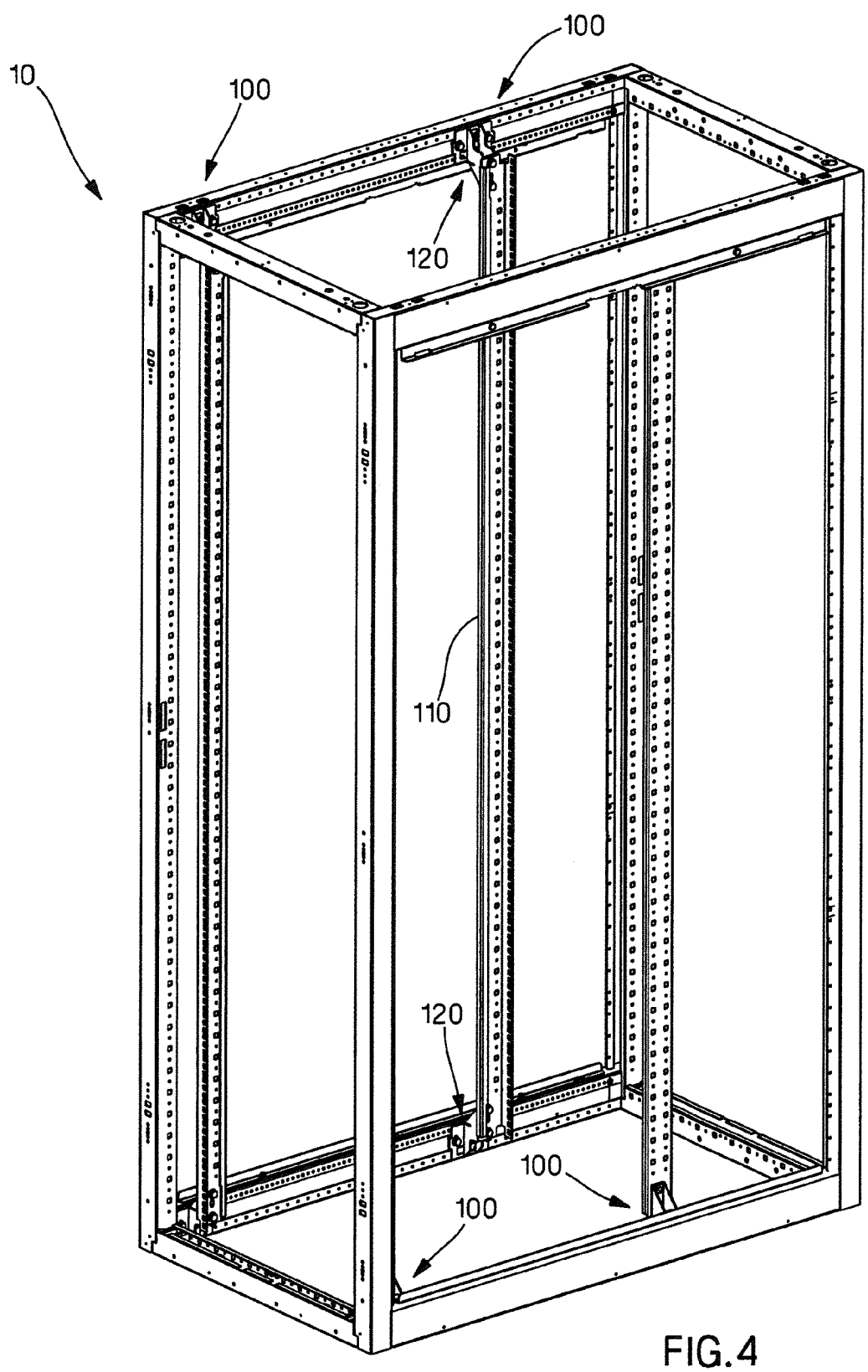
FIG. 4 is a perspective view of the equipment rail and bracket assembly of FIG. 1 mounted to a cabinet.
Figure 5:
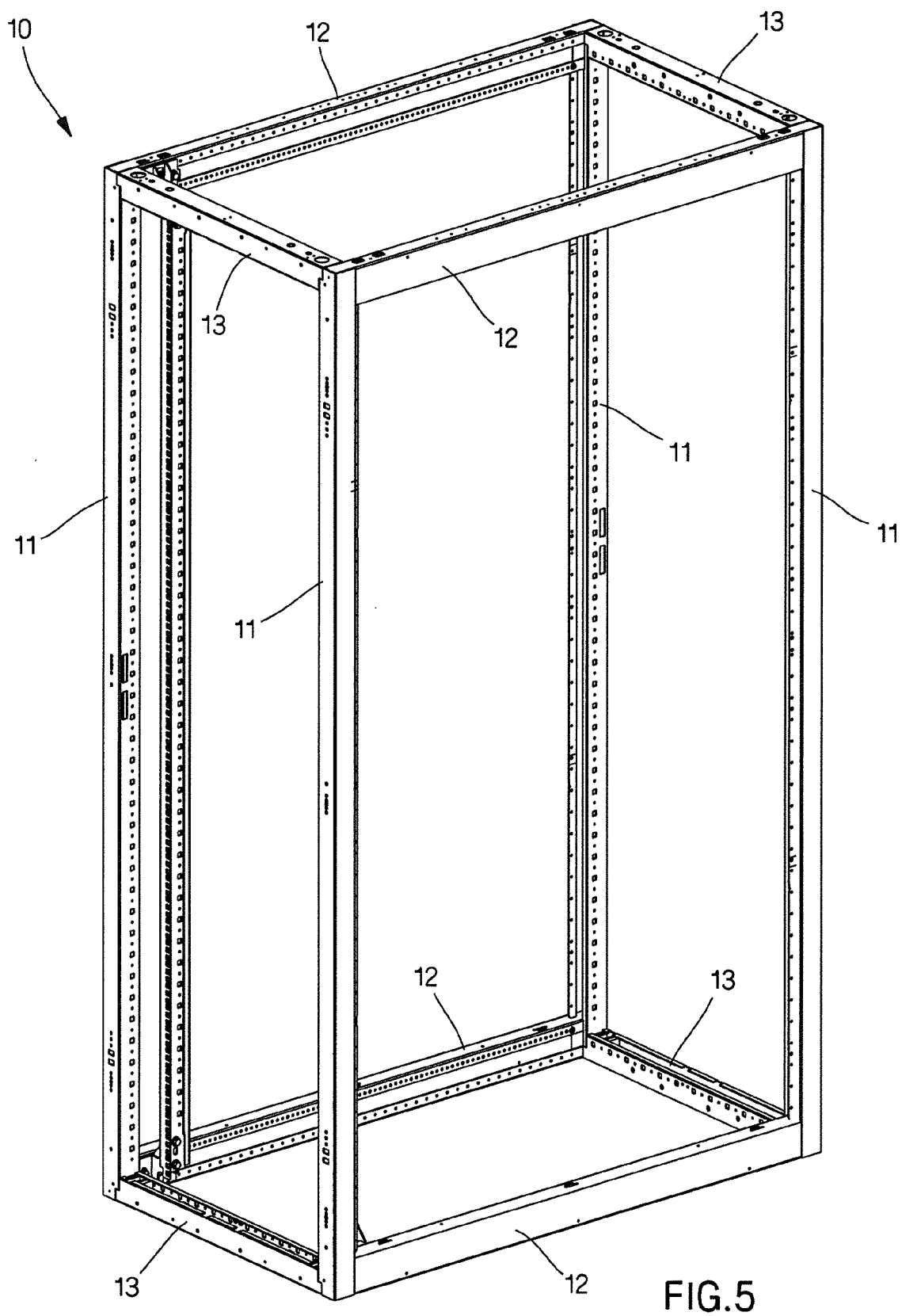
FIG. 5 is a perspective view of the cabinet of FIG. 4.
Figure 6:
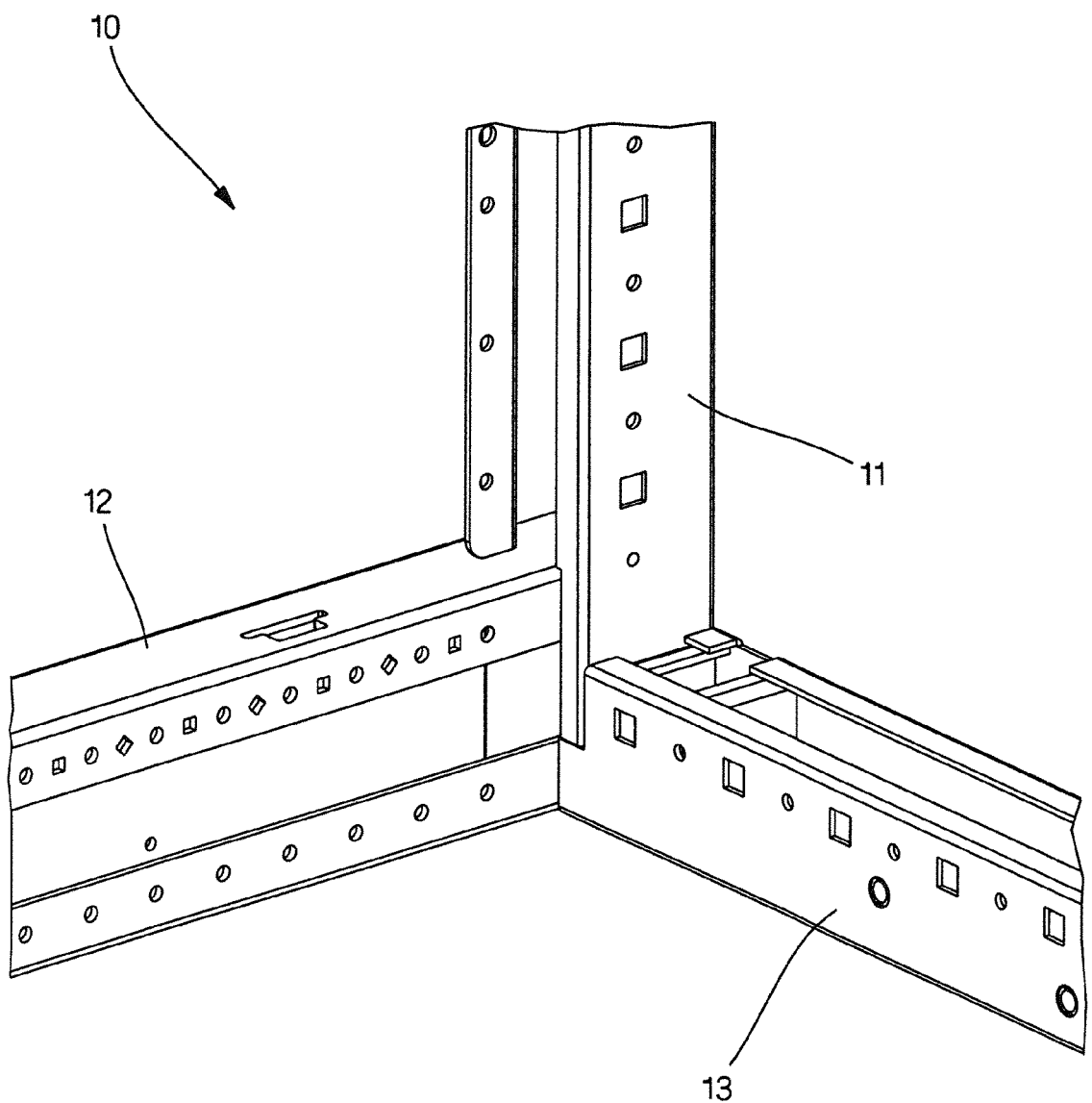
FIG. 6 is an enlarged view of the cabinet of FIG. 5, showing a corner thereof.
Figure 7:
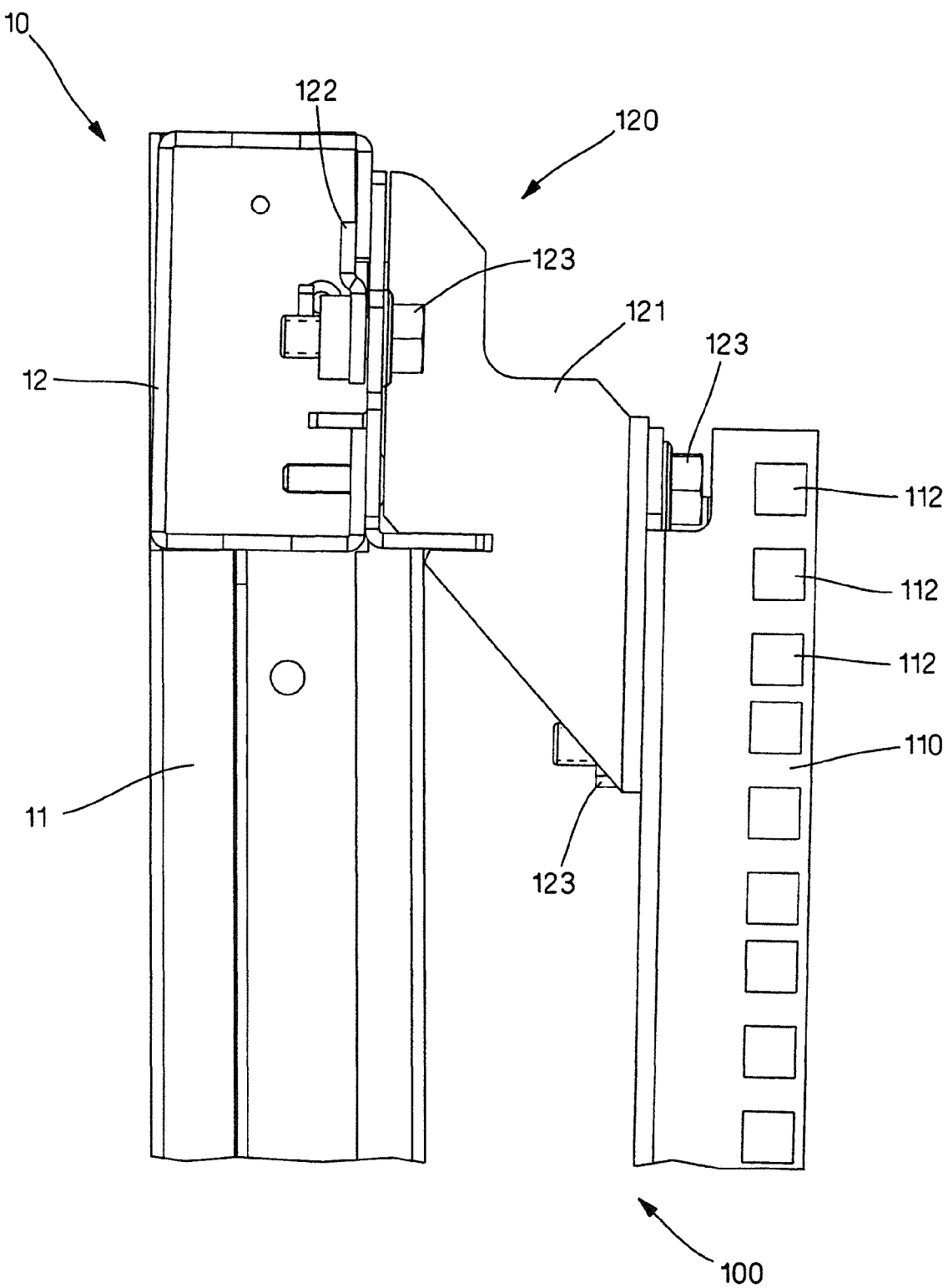
FIG. 7 is an enlarged cross-sectional view of the equipment rail and bracket assembly of FIG. 1, showing the top portion thereof mounted to the cabinet.
Figure 8:
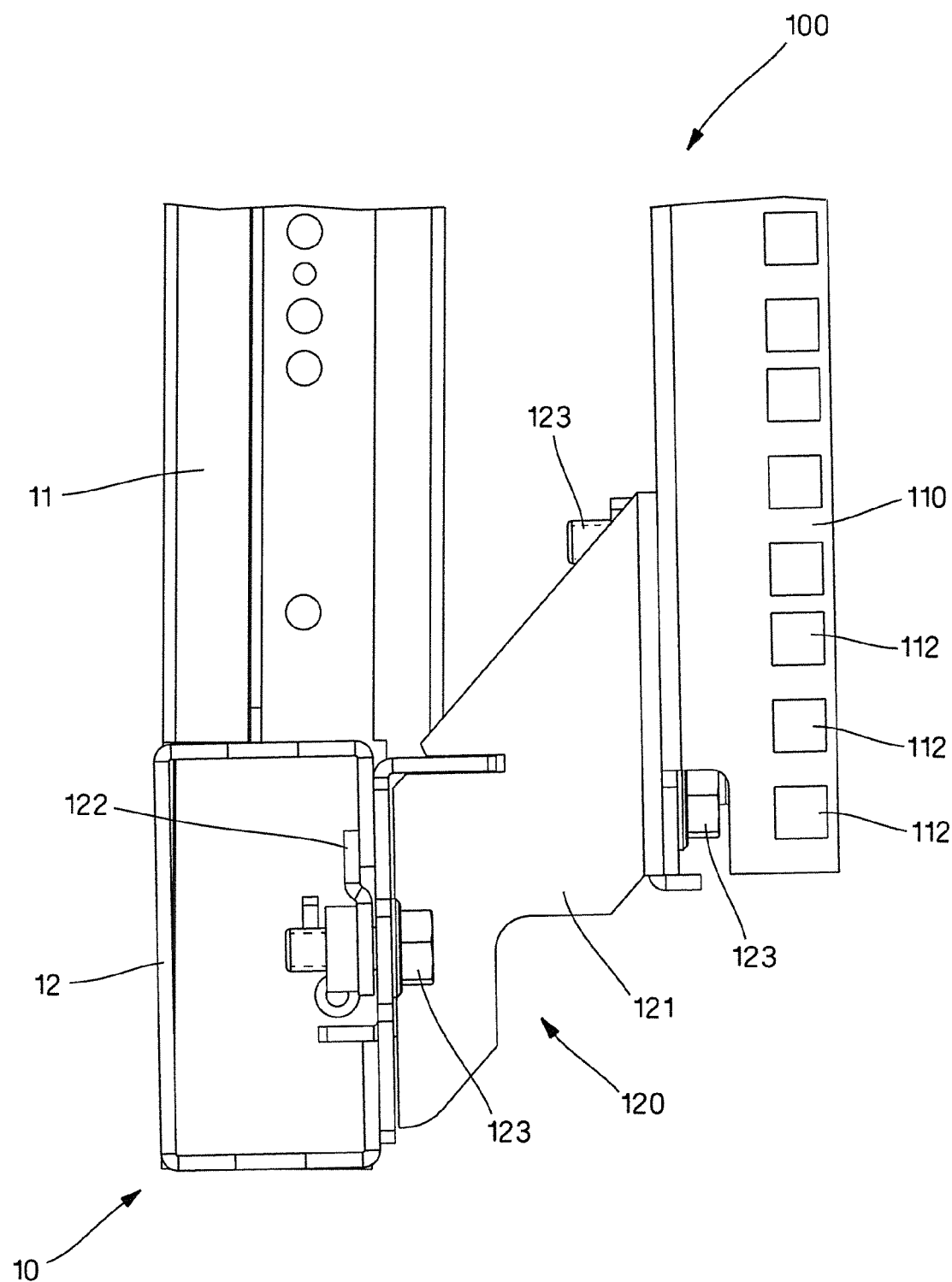
FIG. 8 is an enlarged cross-sectional view of the equipment rail and bracket assembly of FIG. 1, showing the bottom portion thereof mounted to the cabinet.
Figure 9:
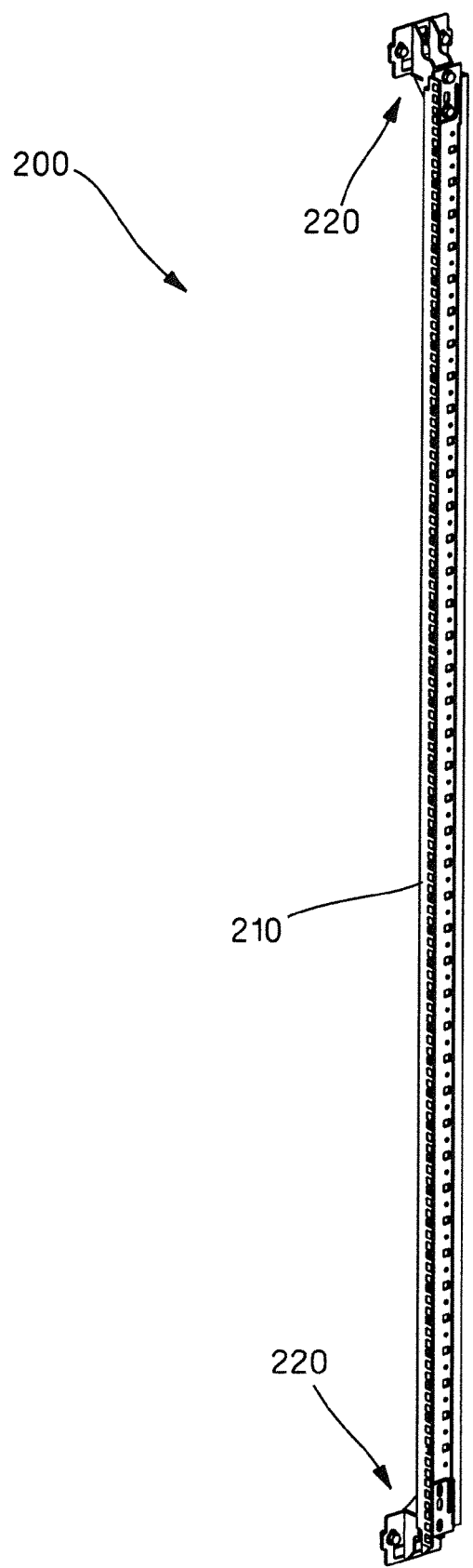
FIG. 9 is a perspective view of an equipment rail and bracket assembly according to an embodiment of the present invention.
Figure 10:
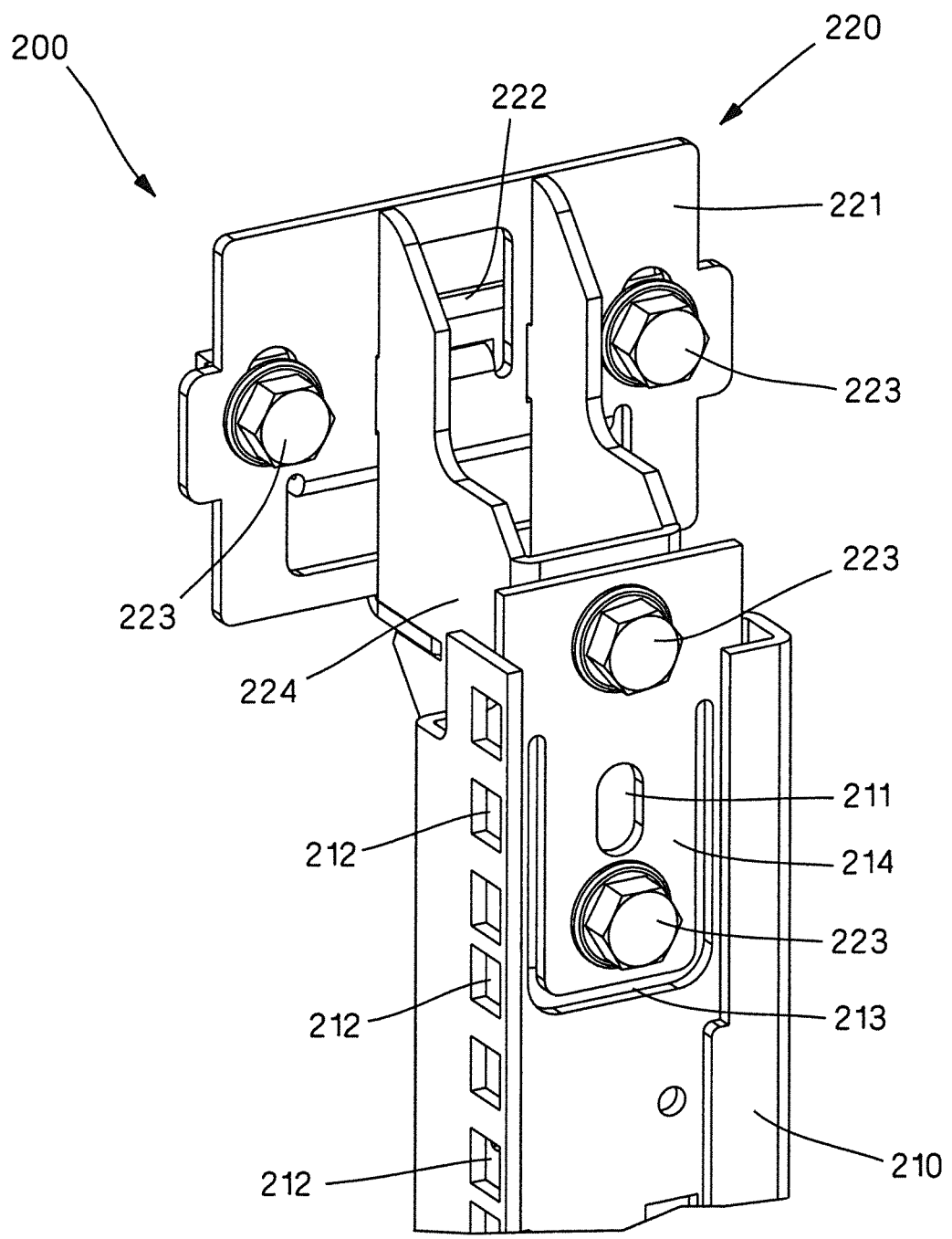
FIG. 10 is an enlarged view of the equipment rail and bracket assembly of FIG. 9, showing a top portion thereof.

As best seen in FIGS. 9 and 10, the equipment rail and bracket assembly 200 is similar to the equipment rail and bracket assembly 100 of FIGS. 1-8. That is, the equipment rail and bracket assembly 200 includes an equipment rail 210 and a pair of bracket assemblies 220, which are similar to the equipment rail 110 and the bracket assemblies 120. For example, each of the bracket assemblies 220 includes a bracket 221, a clamp 222, and a plurality of fasteners 223, which are similar to the bracket 121, the clamp 122, and the fasteners 123. Additionally, the equipment rail 210 includes a plurality of bracket mounting openings 211 and a plurality of equipment mounting openings 212, which are similar to bracket mounting openings 111 and the equipment mounting openings 112.

Figure 11:
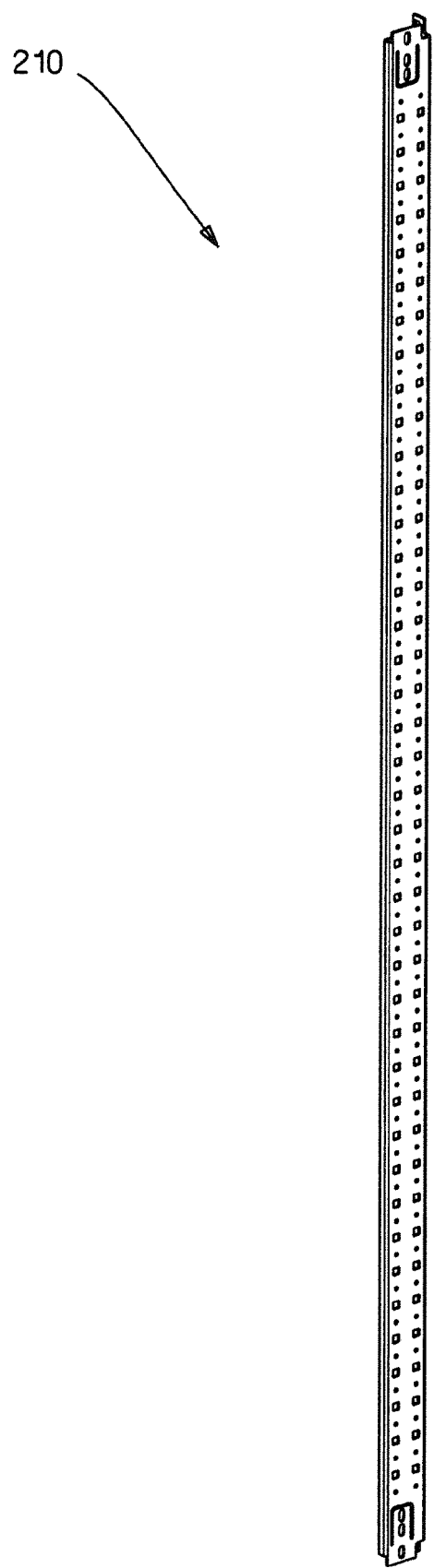
FIG. 11 is a perspective view of an equipment rail for the equipment rail and bracket assembly of FIG. 9.
Figure 12:
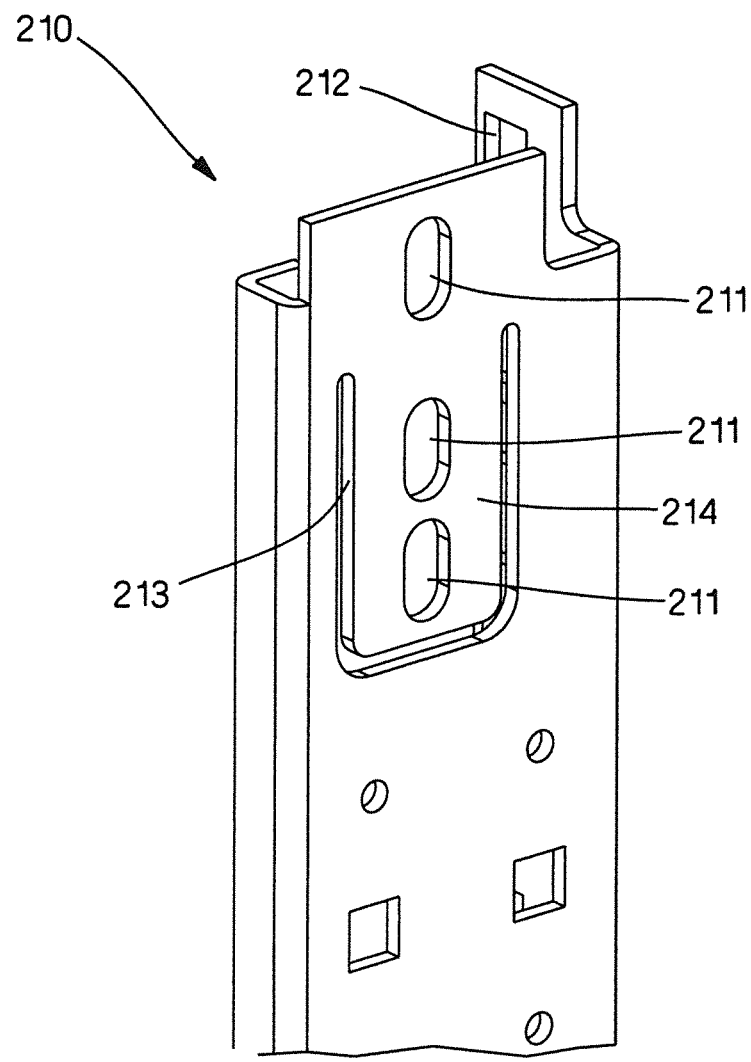
FIG. 12 is an enlarged view of the equipment rail of FIG. 11, showing the top portion thereof.

However, as best seen in FIGS. 11 and 12, the equipment rail 210 includes a pair of relief cut-outs 213, each of which forms a flexible tongue 214 on the equipment rail 210. The flexible tongue includes at least one of the bracket mounting openings 211.

Figure 13:
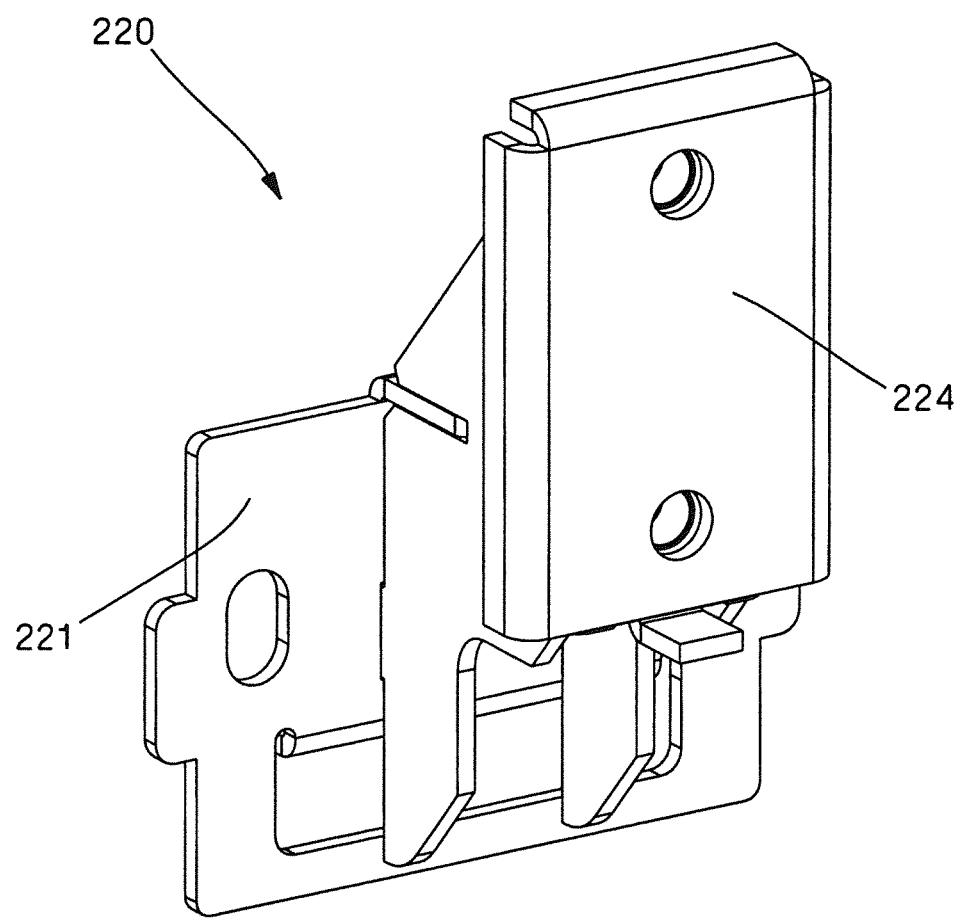
FIG. 13 is a perspective view of a bracket and a reinforcement plate for the equipment rail and bracket assembly of FIG. 9.
Figure 14:
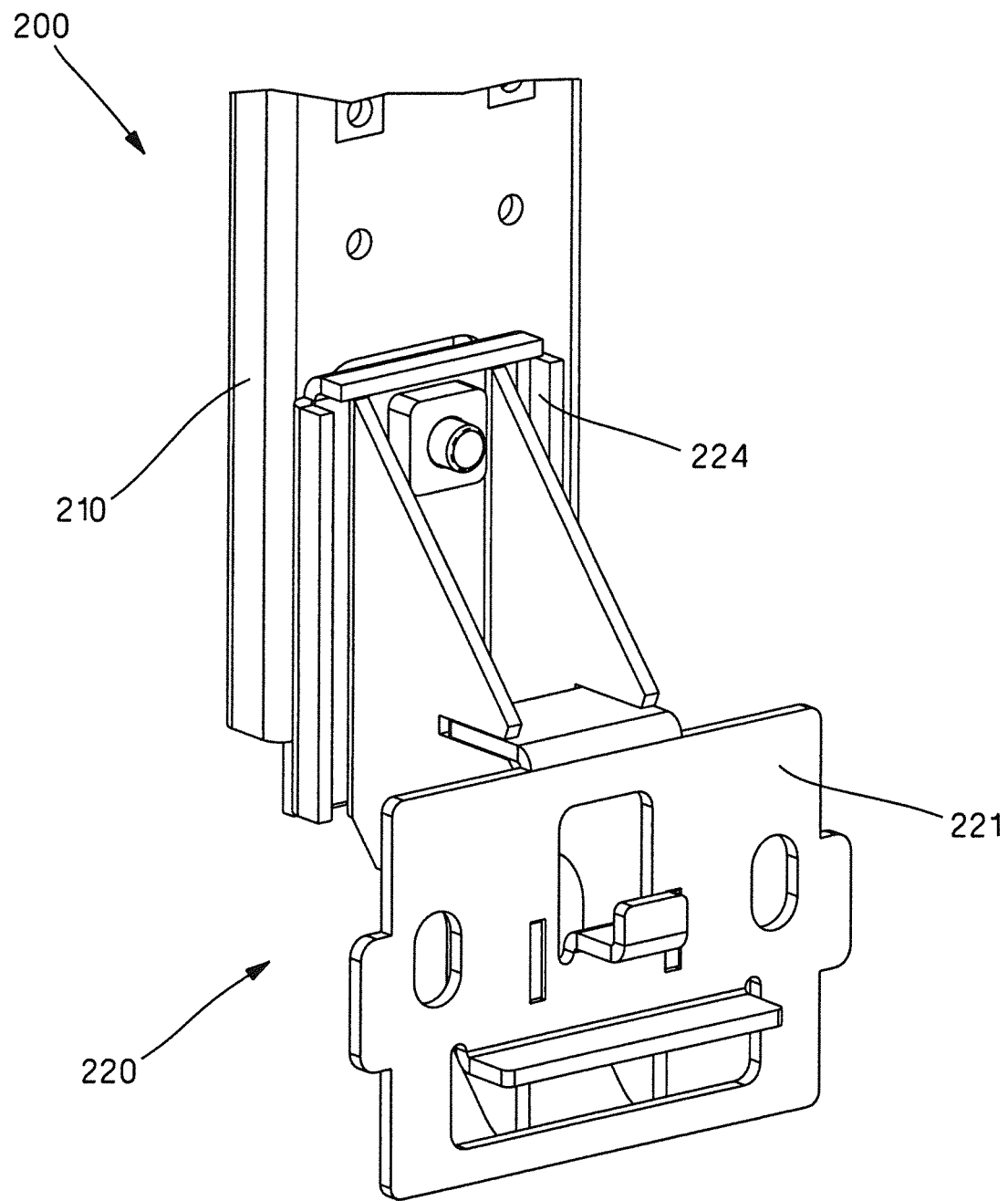
FIG. 14 is a perspective view of the bracket and the reinforcement plate of FIG. 13 mounted to the equipment rail of FIG. 11.

Additionally, as best seen in FIGS. 13 and 14, each of the bracket assemblies 220 includes a reinforcement plate 224 positioned between the equipment rail 210 and the bracket 221. Preferably, the bracket 221 and the reinforcement plate 224 are separate components, but it is likewise contemplated that the bracket 221 and the reinforcement plate 224 are integrally formed.

Figure 15:
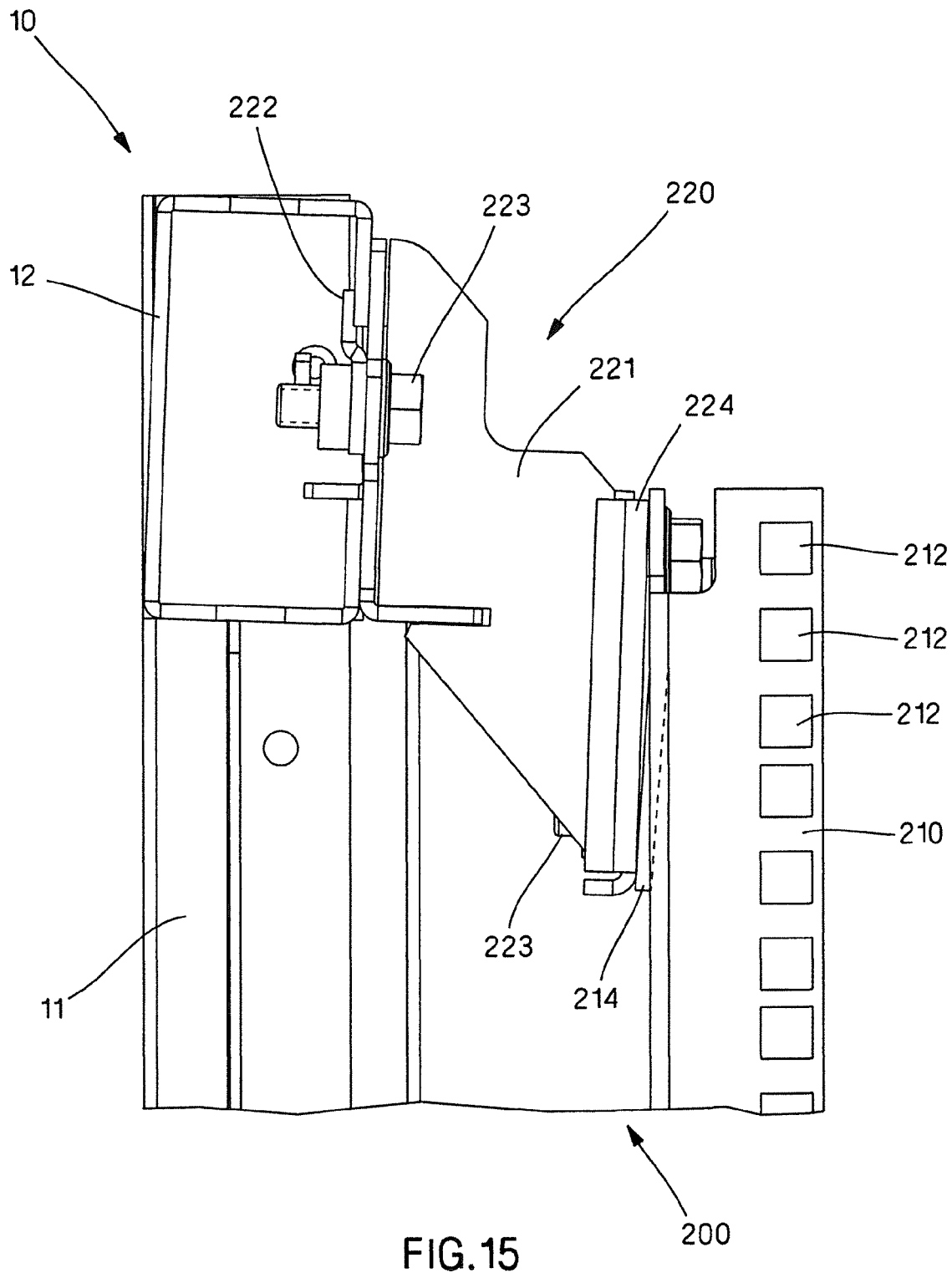
FIG. 15 is an enlarged cross-sectional view of the equipment rail and bracket assembly of FIG. 9, showing the top portion thereof mounted to a cabinet.
Figure 16:
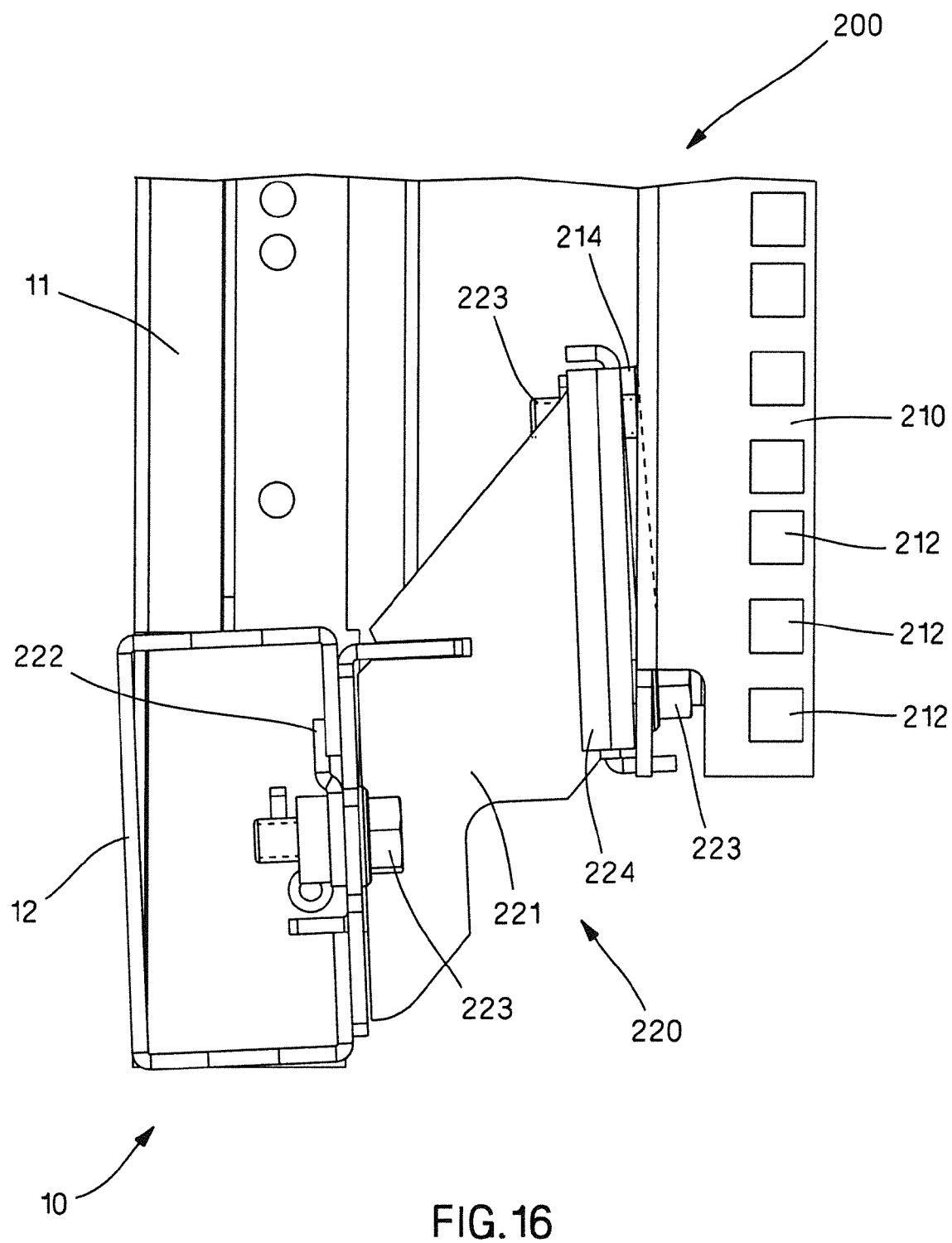
FIG. 16 is an enlarged cross-sectional view of the equipment rail and bracket assembly of FIG. 9, showing the bottom portion thereof mounted to a cabinet.

As shown in FIGS. 15 and 16, when the equipment rail and bracket assembly 200 is mounted to the cabinet 10, the flexible tongues 214 rotate away from the equipment rail 210 (clockwise in FIG. 15 and counterclockwise in FIG. 16) to accommodate the angled front-to-back beams 12, which prevents the equipment rail 210 from bowing.

Figure 17:
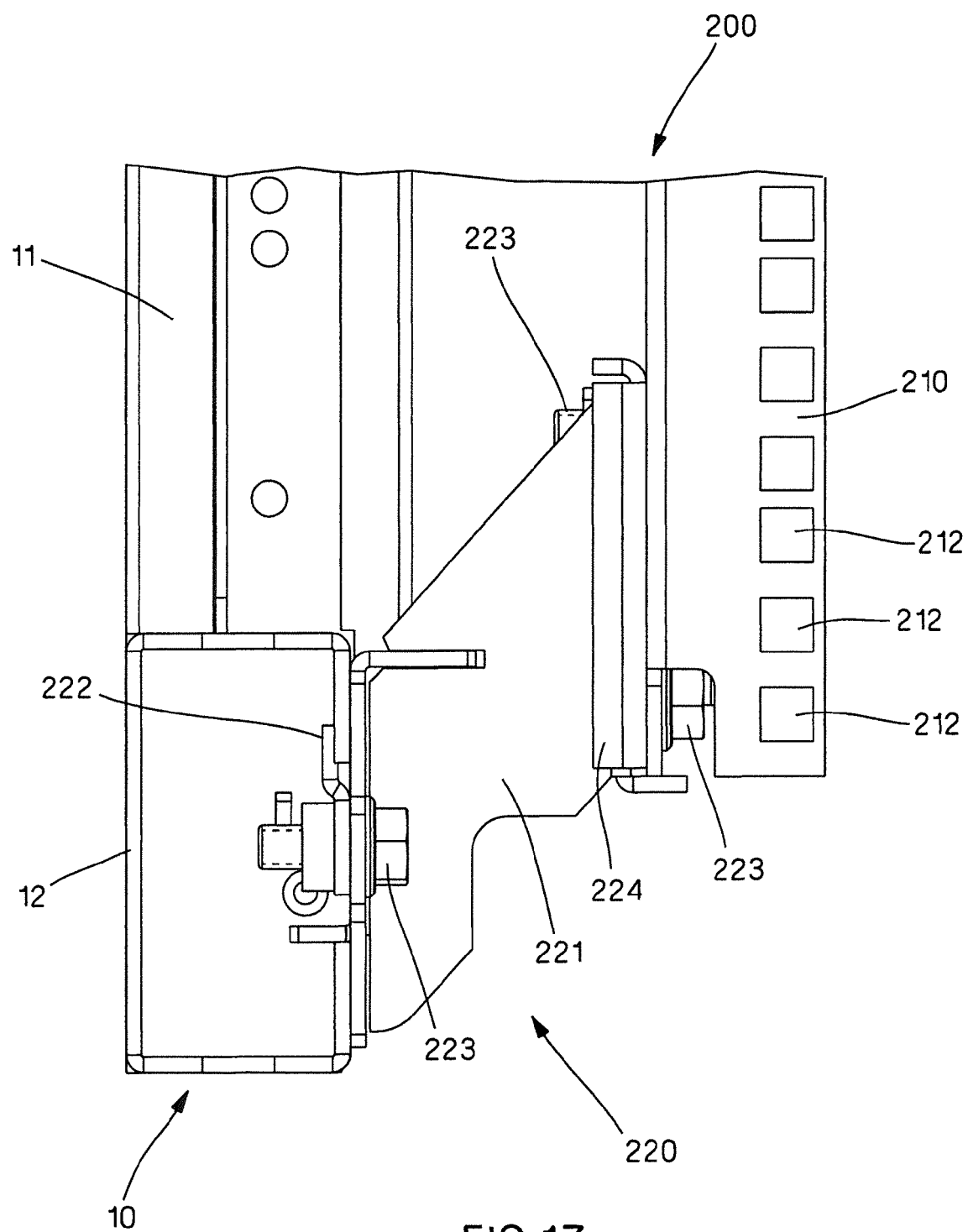
FIG. 17 is an enlarged cross-sectional view of the equipment rail and bracket assembly of FIG. 9, showing the bottom portion thereof mounted to a cabinet and under load from equipment mounted thereon.

Additionally, as shown in FIG. 17, when equipment is mounted to the equipment rail 210, the weight of the equipment causes the flexible tongue 214 disposed at the bottom of the equipment rail 210 to rotate toward the equipment rail 210 (clockwise in FIG. 17). The reinforcement plate 224 prevents the bracket 221 from rotating through the relief cut-out 213 in the equipment rail 210.

While this invention has been described in conjunction with the exemplary embodiments outlined above, various alternatives, modifications, variations, and/or improvements, whether known or presently unforeseen, may become apparent. Accordingly, the exemplary embodiments of the invention as set forth above are intended to be illustrative, not limiting. Various changes may be made without departing from the spirit and scope of the invention.

The invention claimed is:

1. An equipment rail and bracket assembly comprising:
a bracket, the bracket including a mounting surface; and
an equipment rail mounted to the mounting surface of the bracket, the equipment rail including a relief cut-out and a flexible tongue formed by the relief cut-out, the flexible tongue including a bracket mounting opening for mounting the equipment rail to the bracket,
wherein the flexible tongue rotates relative to the equipment rail when the bracket is mounted to a cabinet,
the equipment rail and bracket assembly further comprising a reinforcement plate positioned directly between the flexible tongue of the equipment rail and the mounting surface of the bracket, the reinforcement plate including a dimension greater than a corresponding dimension of the relief cut-out to prevent the bracket from rotating through the relief cut-out when equipment is mounted to the equipment rail.

2. The equipment rail and bracket assembly of claim 1, wherein the equipment rail includes a plurality of equipment mounting openings for mounting equipment to the equipment rail.

3. The equipment rail and bracket assembly of claim 1, wherein the equipment rail includes a plurality of bracket mounting openings for mounting the equipment rail to the bracket.

4. The equipment rail and bracket assembly of claim 3, wherein the flexible tongue includes at least one of the plurality of bracket mounting openings.

5. The equipment rail and bracket assembly of claim 1, wherein the equipment rail includes a first end and a second end opposite the first end, wherein the first end of the equipment rail is mounted to the bracket.

6. The equipment rail and bracket assembly of claim 5, further comprising a second bracket, wherein the second end of the equipment rail is mounted to the second bracket.

7. The equipment rail and bracket assembly of claim 6, wherein the second end of the equipment rail includes a second relief cut-out and a second flexible tongue formed by the second relief cut-out, the second flexible tongue including a second bracket mounting opening for mounting the equipment rail to the second bracket.

8. The equipment rail and bracket assembly of claim 7, wherein the second flexible tongue rotates relative to the equipment rail when the second bracket is mounted to the cabinet.

9. The equipment rail and bracket assembly of claim 8, wherein the first flexible tongue and the second flexible tongue rotate away from the equipment rail when the bracket is mounted to the cabinet.

10. The equipment rail and bracket assembly of claim 9, wherein the second flexible tongue rotates toward the equipment rail when equipment is mounted to the equipment rail.

11. The equipment rail and bracket assembly of claim 1, wherein the bracket and the reinforcement plate are separate components.

12. The equipment rail and bracket assembly of claim 1, wherein the bracket and the reinforcement plate are integrally formed.

13. The equipment rail and bracket assembly of claim 1, further comprising a clamp, wherein the bracket is mounted to the clamp such that the cabinet is positioned between the clamp and the bracket.

* * * * *